(12) United States Patent
Yamamoto

(10) Patent No.: US 12,088,262 B2
(45) Date of Patent: Sep. 10, 2024

(54) AUDIO OUTPUT DEVICE

(71) Applicant: DENSO ELECTRONICS CORPORATION, Anjo (JP)

(72) Inventor: Chikara Yamamoto, Anjo (JP)

(73) Assignee: DENSO ELECTRONICS CORPORATION, Anjo (JP)

( * ) Notice: Subject to any disclaimer, the term of this patent is extended or adjusted under 35 U.S.C. 154(b) by 398 days.

(21) Appl. No.: 17/408,871

(22) Filed: Aug. 23, 2021

(65) Prior Publication Data

US 2021/0384873 A1 Dec. 9, 2021

Related U.S. Application Data

(63) Continuation of application No. PCT/JP2020/002719, filed on Jan. 27, 2020.

(30) Foreign Application Priority Data

Mar. 13, 2019 (JP) ................................. 2019-045657

(51) Int. Cl.
*H03F 3/217* (2006.01)
*B60K 35/00* (2024.01)

(52) U.S. Cl.
CPC ............ *H03F 3/217* (2013.01); *B60K 35/00* (2013.01); *H03F 2200/03* (2013.01); *H03F 2200/351* (2013.01)

(58) Field of Classification Search
CPC ............ H03F 3/217; H03F 2200/03; H03F 2200/351; H03F 3/187; H03F 3/2171; B60K 35/00; B60K 2370/157; B60K 2370/167; B60K 2370/178; B60K 2370/193; B60K 2370/797; B60Q 5/00; B60Q 5/006; B60Q 2300/45; G10K 15/04; H04R 3/00; B60Y 2200/91; B60Y 2200/92
USPC ........................................ 330/251, 10, 207 A
See application file for complete search history.

(56) References Cited

U.S. PATENT DOCUMENTS 9,694,745 B2 * 7/2017 Tsuzuki ................. B60Q 5/005
2015/0035660 A1 2/2015 Sakakibara et al.

FOREIGN PATENT DOCUMENTS

| JP | S59194596 A | 11/1984 |
|---|---|---|
| JP | S64-58125 A | 3/1989 |
| JP | H03-104416 A | 5/1991 |
| JP | H0697831 A | 4/1994 |
| JP | 2001069008 A | 3/2001 |
| JP | 2012171462 A | 9/2012 |
| JP | 2015027828 A | 2/2015 |

* cited by examiner

*Primary Examiner* — Hieu P Nguyen
(74) *Attorney, Agent, or Firm* — Harness, Dickey & Pierce, P.L.C.

(57) ABSTRACT

An audio output device includes PWM output devices, a weighting unit, a mixer, and an amplifier. The PWM output devices divide audio data into multiple parts including an upper bit part to a lower bit part, and output the multiple parts of the audio data as PWM outputs. The weighting unit weights the PWM outputs from the PWM output devices. The mixer synthesizes the PWM outputs after being weighted. The amplifier supplies an electric current to a sounding body in accordance with a synthesis result by the mixer to cause the sounding body to emit a sound.

6 Claims, 4 Drawing Sheets

AUDIO OUTPUT DEVICE

CROSS REFERENCE TO RELATED APPLICATIONS

The present application is a continuation application of International Patent Application No. PCT/JP2020/002719 filed on Jan. 27, 2020, which designated the U.S. and claims the benefit of priority from Japanese Patent Application No. 2019-045657 filed on Mar. 13, 2019. The entire disclosures of all of the above applications are incorporated herein by reference.

TECHNICAL FIELD

The present disclosure relates to an audio output device that emits a sound based on audio data.

BACKGROUND

In recent years, since electric vehicles (EV vehicles) and hybrid vehicles (HV vehicles) are structurally less noisy and it is difficult for pedestrians to notice the approach of these vehicles, some vehicles have a vehicle approach notification device that emits a vehicle approach notification sound such as a pseudo-engine sound or a pseudo-motor sound in order to raise awareness for the approaching vehicles.

SUMMARY

The present disclosure provides an audio output device includes PWM output devices, a weighting unit, a mixer, and an amplifier. The PWM output devices divide audio data into multiple parts including an upper bit part and a lower bit part, and output the multiple parts of the audio data as PWM outputs. The weighting unit weights the PWM outputs from the PWM output devices. The mixer synthesizes the PWM outputs after being weighted. The amplifier supplies electric current to a sounding body in accordance with a synthesis result by the mixer to cause the sounding body to emit a sound.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
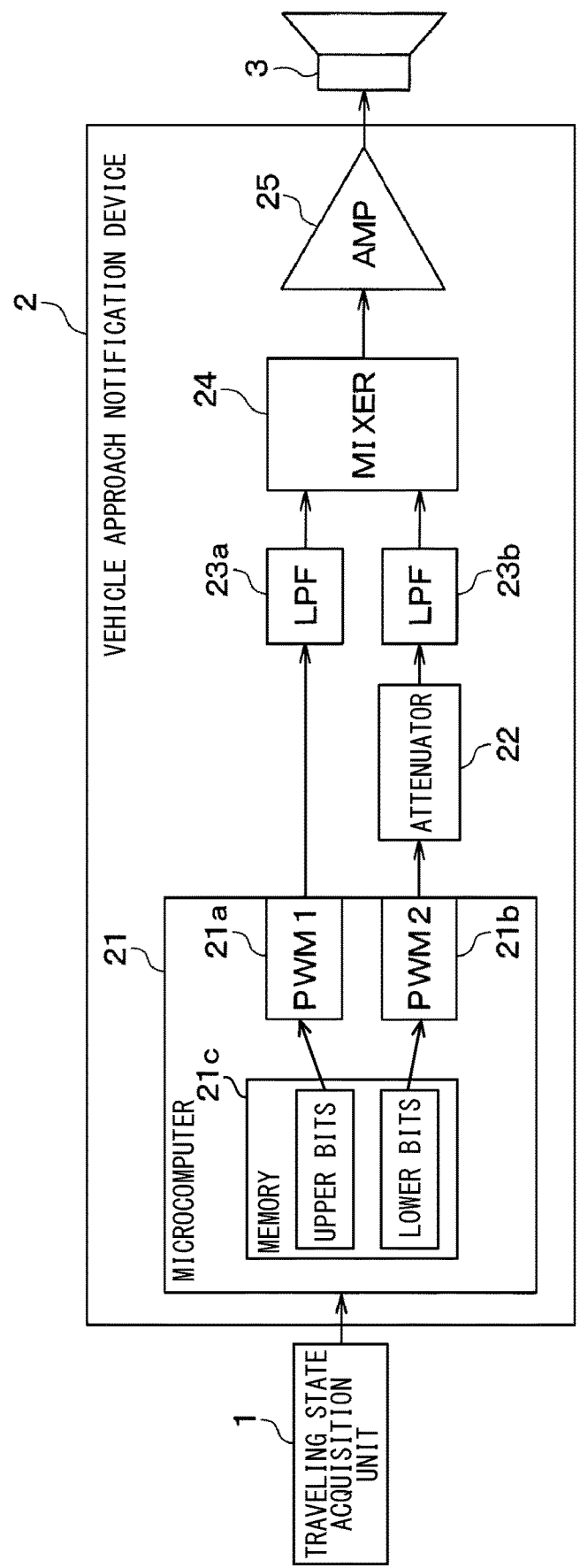
FIG. 1 is a block diagram of a vehicle approach notification device according to a first embodiment.

A vehicle approach notification device may use, as a sounding method, a method in which audio data such as pulse code modulation (PCM) data stored in a memory of a microcomputer, that is, an audio signal encoded by converting a volume of a sound into a data code is sampled every sampling cycle, set to a pulse width modulation (PWM) output device, and is emitted.

An upper limit of a signal resolution in an audio signal output technology using a PWM output device is determined by an operating clock frequency/a carrier frequency of a CPU (central processing unit) in a microcomputer. Since there is a relationship of a sampling frequency of an audio signal ≤the carrier frequency, for example, when an inexpensive general-purpose microcomputer is used, a resolution of the PWM output device may be insufficient for the audio data to be output.

For example, when an audio signal having a carrier frequency of 32 kHz is output from a PWM output device by a microcomputer having an operating clock of 32 MHz, the resolution is 32 MHz/32 kHz, and the audio signal is expressed in 1000 steps. When this is converted into bit depth, it is equivalent to 10 bits.

On the other hand, for example, in order to handle 16-bit audio data generally used in audio applications in combination with a volume adjustment function required for a notification sound product, 10 bits are not enough, which is a limitation in terms of audio quality. Therefore, in order to improve the audio quality, a high-resolution PWM output device is required.

An audio output device according to one aspect of the present disclosure includes PWM output devices, a weighting unit, a mixer, and an amplifier. The PWM output devices are configured to divide audio data into multiple parts including an upper bit part and a lower bit part, and output the multiple parts of the audio data as PWM outputs. The weighting unit is configured to weight the PWM outputs generated by the PWM output devices. The mixer is configured to synthesize the PWM outputs after being weighted. The amplifier is configured to supply an electric current to a sounding body to cause the sounding body to emit a sound. The electric current corresponds to an output indicating a result of synthesizing by the mixer.

In such a configuration, even if a resolution of each of the PWM output devices is smaller than the number of bits of the audio data, the data corresponding to the upper bit part and the lower bit part of the audio data can be output as the PWM outputs. Then, by weighting each of the PWM outputs and synthesizing the PWM outputs with the mixer, it is possible to express a sound represented by almost the audio data. Therefore, even if the resolution of each of the PWM output devices is not sufficient, it is possible to obtain a substantially high resolution.

The following describes embodiments of the present disclosure with reference to the drawings. In the following embodiments, the same or equivalent parts are denoted by the same reference numerals.

First Embodiment

The following describes a first embodiment. In the present embodiment, a case where an audio output device is applied to a vehicle approach notification device will be described as an example. FIG. 1 is a block diagram of a vehicle approach notification system including a vehicle approach notification device according to the present embodiment. The vehicle approach notification system including the vehicle approach notification device according to the present embodiment will be described with reference to this figure.

As shown in FIG. 1, the vehicle approach notification system has a configuration including a traveling state acquisition unit 1, a vehicle approach notification device 2, and a speaker 3. In the vehicle approach notification system, the vehicle approach notification device 2 emits a pseudo-traveling sound such as a pseudo-engine sound or a pseudo-motor sound from the speaker 3 which is a sounding body based on a detection signal from the traveling state acquisition unit 1 to notify surrounding pedestrians of the approach of a vehicle.

The traveling state acquisition unit 1 is composed of various sensors such as a vehicle speed sensor and an accelerator opening degree sensor, and outputs a vehicle speed detection signal and an accelerator opening degree signal as a traveling state detection signal of the vehicle. Therefore, the vehicle approach notification device 2 receives the traveling state detection signal from the traveling state acquisition unit 1 and acquires information on the vehicle speed and the accelerator opening degree to control the sound according to the vehicle speed and the accelerator opening degree when the vehicle is traveling at a low speed (for example, 20 km/h or less) with little road noise.

The vehicle approach notification device 2 includes a microcomputer 21, an attenuator 22, low-pass filters (LPFs) 23a and 23b, a mixer 24, and a power amplifier (AMP) 25.

The microcomputer 21 has a first PWM output device (PWM1) 21a and a second PWM output device (PWM2) 21b, and also has a memory 21c corresponding to a memory unit and an arithmetic unit corresponding to a controller. The memory 21c stores a sound control program, audio data such as a PCM data that represents the pseudo-traveling sound such as the pseudo-engine sound or the pseudo-motor sound, and data for setting a sampling cycle and volume. The microcomputer 21 reads out the audio data at each sampling cycle, sets the audio data in the first PWM output device 21a and the second PWM output device 21b, and outputs the sound data. By combining these two PWM output devices of the first PWM output device 21a and the second PWM output device 21b, it is possible to output an output waveform corresponding to the audio data with substantially high resolution.

For example, the microcomputer 21 stores in a memory a table of the amount of pitch increase associated with the traveling state of the vehicle such as the vehicle speed and the accelerator opening degree, and the arithmetic unit calculates the amount of pitch increase corresponding to the traveling state such as the vehicle speed and the accelerator opening degree during low-speed traveling. For example, the amount of pitch increase can be increased with increase in the vehicle speed and the accelerator opening degree. Then, the audio data is read at each sampling cycle corresponding to the calculated amount of pitch increase and set in the first PWM output device 21a and the second PWM output device 21b to generate PWM outputs. At this time, in the first PWM output device 21a and the second PWM output device 21b, the PWM outputs are generated using the same carrier frequency with the same phase.

Specifically, when the audio data is, for example, 16 bits and the resolutions of the first PWM output device 21a and the second PWM output device 21b are 10 bits, for example, the audio data is divided into upper 8 bits and lower 8 bits, and the upper bit part is set in the first PWM output device 21a and the lower bit part is set in the second PWM output device 21b. In this way, the PWM output is generated from each of the first PWM output device 21a and the second PWM output device 21b.

The attenuator 22 constitutes a weighting unit that weights the PWM outputs of the first PWM output device 21a and the second PWM output device 21b. In the present embodiment, the attenuator 22 attenuates the PWM output of the second PWM output device 21b.

As described above, the upper bit part of the audio data is set in the first PWM output device 21a to generate the PWM output, and the lower bit part is set in the second PWM output device 21b to generate the PWM output. When the relationship between the upper bit part set in the first PWM output device 21a and the lower bit part set in the second PWM output device 21b is explained in decimal numbers for the sake of simplicity, the upper bit part represents "thousands place" and "hundreds place", the lower bit part represents "tens place" and "ones place", and the upper bit part and the lower bit part represent numbers of different digits. However, the PWM output that is output by setting the upper bit part in the first PWM output device 21a and the PWM output that is output by setting the lower bit part in the second PWM output device 21b are represented by numbers with the same digit. Therefore, it is necessary to weight at least one of the PWM outputs.

Figure 2:
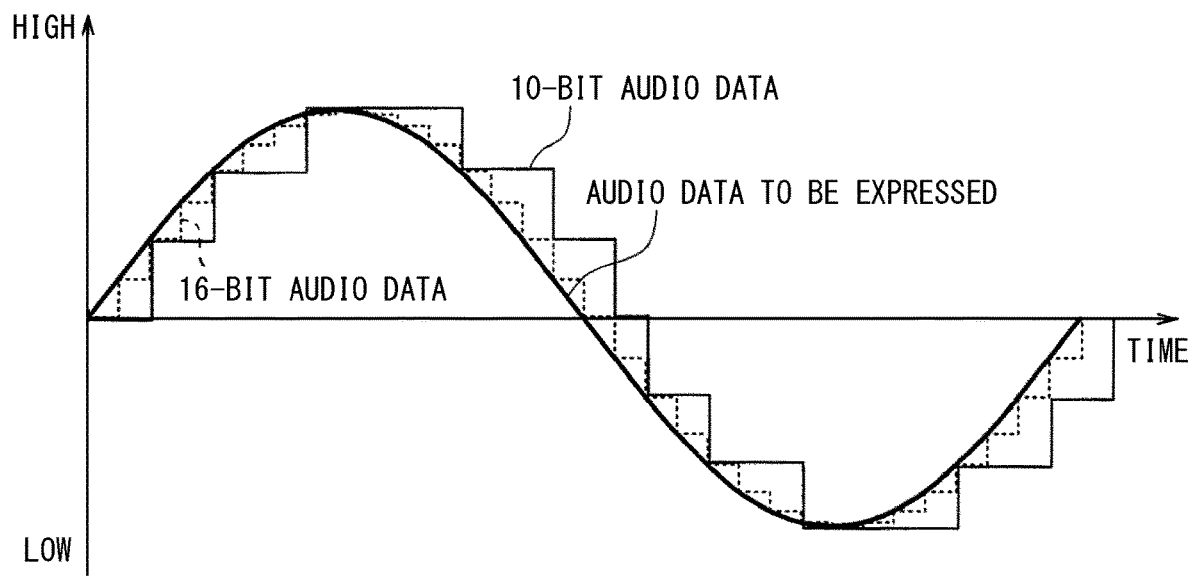
FIG. 2 is a diagram schematically explaining the relationship between audio data to be expressed and 16-bit and 10-bit audio data.

Here, for example, consider a case where a memory stores audio data to be expressed in which a sine wave as shown by a thick line in FIG. 2 is expressed by 16 bits as shown by a thin line. For example, when the operating clock of the microcomputer 21 is 32 MHz and the carrier frequency is 32 kHz, the resolution of each of the PWM output devices is 32 MHz/32 kHz, which is equivalent to 10 bits. In this case, since the resolution of only one PWM output device is only 10 bits, even if an attempt is made to express the audio data as shown in FIG. 2, only the upper 10 bits can be expressed, which becomes a coarse PWM output as shown by the broken line in FIG. 2. That is, the audio data expressed in 16 bits cannot be sufficiently expressed in 10 bits.

On the other hand, the difference between the audio data represented by 16 bits and the audio data represented by 10 bits corresponds to lower 6 bits of the audio data represented by 16 bits. Therefore, if another PWM output device is provided to output this part of the audio data and this part of the audio data is combined with the audio data expressed in 10 bits, it is possible to output audio data substantially expressed in 16 bits even though the resolution of each of the PWM output devices is smaller than the number of bits of the audio data.

Therefore, as described above, the upper bit part of the audio data are set in the first PWM output device 21a, the lower bit part of the audio data are set in the second PWM output device 21b, and the PWM output is generated from each. It is sufficient that the number of bits of the upper bit part set in the first PWM output device 21a and the number of bits of the lower bit part set in the second PWM output device 21b is less than or equal to the resolution of each of the PWM output devices, and the total number of bits is the number of bits of audio data. In the present embodiment, both the upper bit part and the lower bit part have 8 bits and have the same number of bits. However, as for the lower bit part, for example, even if there is no lowest bit, the audio data can be expressed almost, so that the total does not necessarily have to be the number of bits of the audio data.

Then, when the PWM output is generated from each of the first PWM output device 21a and the second PWM output device 21b in this way, the PWM output may be combined. However, since it is a state in which each PWM output represents the "same digit", the amplitude of each PWM output waveform is set at the same level. Therefore, it is necessary to weight each of the PWM outputs. For example, it is necessary to use the PWM output of the first PWM output device 21a as it is, and use the PWM output of the second PWM output device 21b with attenuation. Then, in the present embodiment, the attenuator 22 is used to attenuate the PWM output of the second PWM output device 21b.

Figure 3:
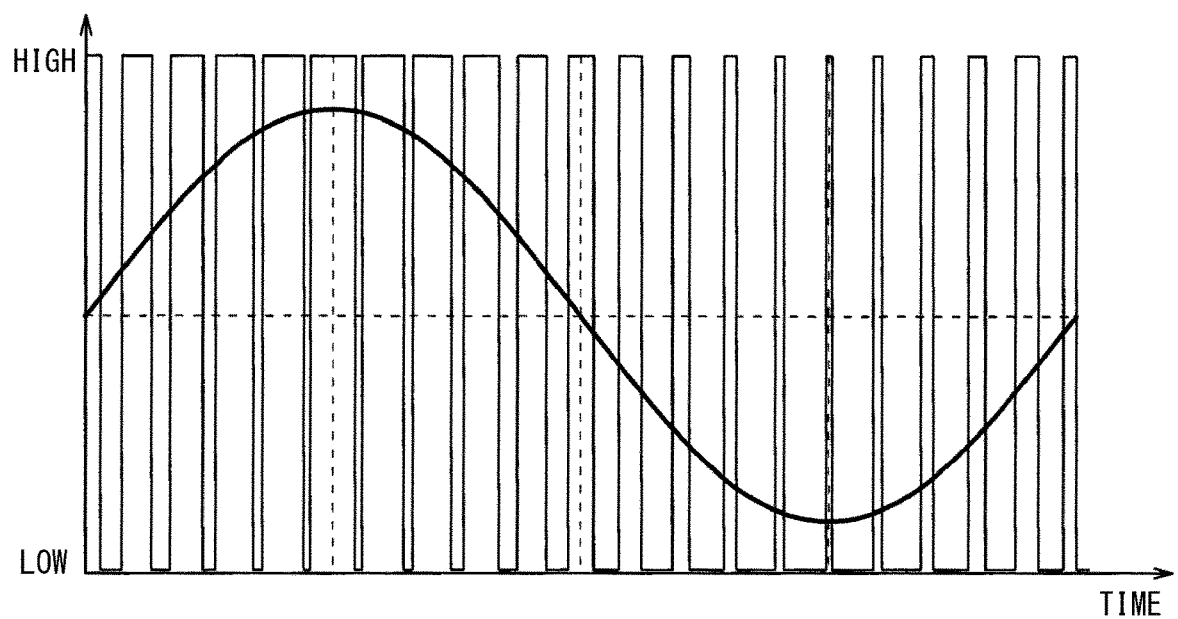
FIG. 3 is a diagram illustrating what kind of duty ratio is represented when audio data is output as a PWM output.

More specifically, in the PWM output, the audio data is represented by the duty ratio. When the audio data is represented by a sine wave shown in FIG. 3, as the image of the duty ratio shown in the figure, the duty ratio decreases with decrease in amplitude value and the duty ratio increases with increase in amplitude value. Specifically, when the operating clock of the microcomputer 21 is 32 MHz and the first PWM output device 21a and the second PWM output device 21b output 8-bit PWM outputs, 32 MHz/256 is the transmission cycle of one sample. The duty ratio is expressed by the number of "0" and "1" data for the number of clocks included in the transmission cycle of one sample, and is expressed as the ratio of the number of continuous "0" data to the number of continuous "1" data. Since both the PWM output of the first PWM output device 21a and the PWM output of the second PWM output device 21b are only represented by the duty ratio, the amplitude of the audio data is represented at the same level with the PWM output as it is.

Therefore, the PWM output of the first PWM output device 21a and the PWM output of the second PWM output device 21b are weighted. Regarding the weighting, when a difference in bit number between the upper bit part and the lower bit part is n, the weighting amount is nth power of 2. Therefore, the attenuation ratio of the attenuator 22 is set to be the difference in bit number×−6 dB. In the present embodiment, since the difference in bit number between the upper bit part and the lower bit part is 8, the PWM output of the second PWM output device 21b is attenuated by the attenuator 22 by −48 dB.

The LPFs 23a and 23b correspond to filter units and play a role of demodulating an audio waveform which is an output waveform corresponding to the audio data. Therefore, the LPF23a demodulates the audio waveform from the PWM output of the first PWM output device 21a, and the LPF23b demodulates the audio waveform from the PWM output of the second PWM output device 21b attenuated via the attenuator 22. Then, the PWM outputs demodulated into the audio waveforms by the LPF23a and 23b are input to the mixer 24.

The mixer 24 synthesizes the PWM outputs input from the LPFs 23a and 23b. In this way, the PWM output of the first PWM output device 21a and the PWM output of the first PWM output device 21a attenuated by the attenuator 22 are combined so that the output waveform substantially corresponding to the audio data expressed in 16 bits can be obtained.

The amplifier 25 supplies an electric current corresponding to an output indicating the synthesis result of the mixer 24 to the speaker 3. The output of the mixer 24 has an output waveform that substantially corresponds to the audio data expressed in 16 bits. Therefore, the speaker 3 emits a sound corresponding to the audio data expressed in 16 bits.

The vehicle approach notification system of the present embodiment is configured as described above. In the vehicle approach notification system, the PWM output is output from the microcomputer 21 according to the vehicle state, and the electric current corresponding to the PWM output is supplied to the speaker 3, so that the sound is emitted according to the vehicle state. At this time, as described above, the audio data is divided into the upper bit part and the lower bit part, the upper bit part is set in the first PWM output device 21a to generate the PWM output, and the lower bit part is set in the second PWM output device 21b to generate the PWM output. Then, the PWM output of the first PWM output device 21a and the PWM output of the second PWM output device 21b are weighted and then combined by the mixer 24.

Accordingly, even if the resolutions of the first PWM output device 21a and the second PWM output device 21b are smaller than the number of bits of the audio data, the data corresponding to the upper bit part and the data corresponding to the lower bit part of the audio data can be used as the PWM outputs. Then, by weighting each of the PWM outputs and synthesizing the PWM outputs with the mixer 24, it is possible to express a sound represented by almost the audio data. Therefore, even if the resolution of each the PWM output devices is not sufficient, it is possible to obtain a substantially high resolution.

Second Embodiment

The following describes a second embodiment. The present embodiment differs from the first embodiment in that the arrangement of the LPF and the mixer is changed, and the other parts are the same as those in the first embodiment. Therefore, only the parts different from the first embodiment will be described.

Figure 4:
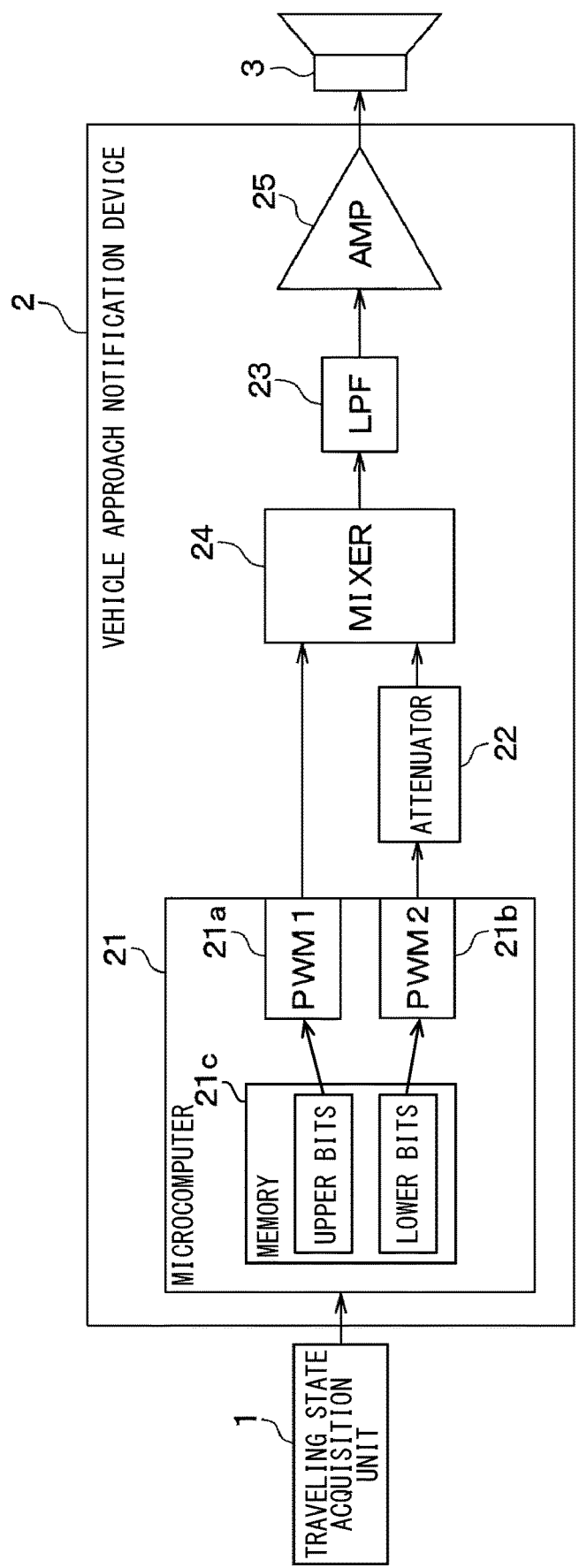
FIG. 4 is a block diagram of a vehicle approach notification device according to a second embodiment.

As shown in FIG. 4, in the present embodiment, the PWM output of the first PWM output device 21a and the PWM output of the second PWM output device 21b after being attenuated by the attenuator 22 are combined by the mixer 24. An LPF 23 is provided between the mixer 24 and the amplifier 25 so that the output of the mixer 24 is demodulated into an audio waveform by the LPF 23.

In this way, even if the LPF 23 is arranged in the post stage of the mixer 24, the same effect as that of the first embodiment can be obtained.

Third Embodiment

The following describes a third embodiment. The present embodiment differs from the first and second embodiments in the configuration of the weighting unit, and the other parts are the same as those in the first and second embodiments. Therefore, only the parts different from the first embodiment and the second embodiment will be described. Here, as in the first embodiment, the configuration in which the mixer 24 is arranged in the post stage of the LPFs 23a and 23b will be described as an example, but the LPF 23 may also be arranged in the post stage of the mixer 24 as in the second embodiment.

Figure 5:
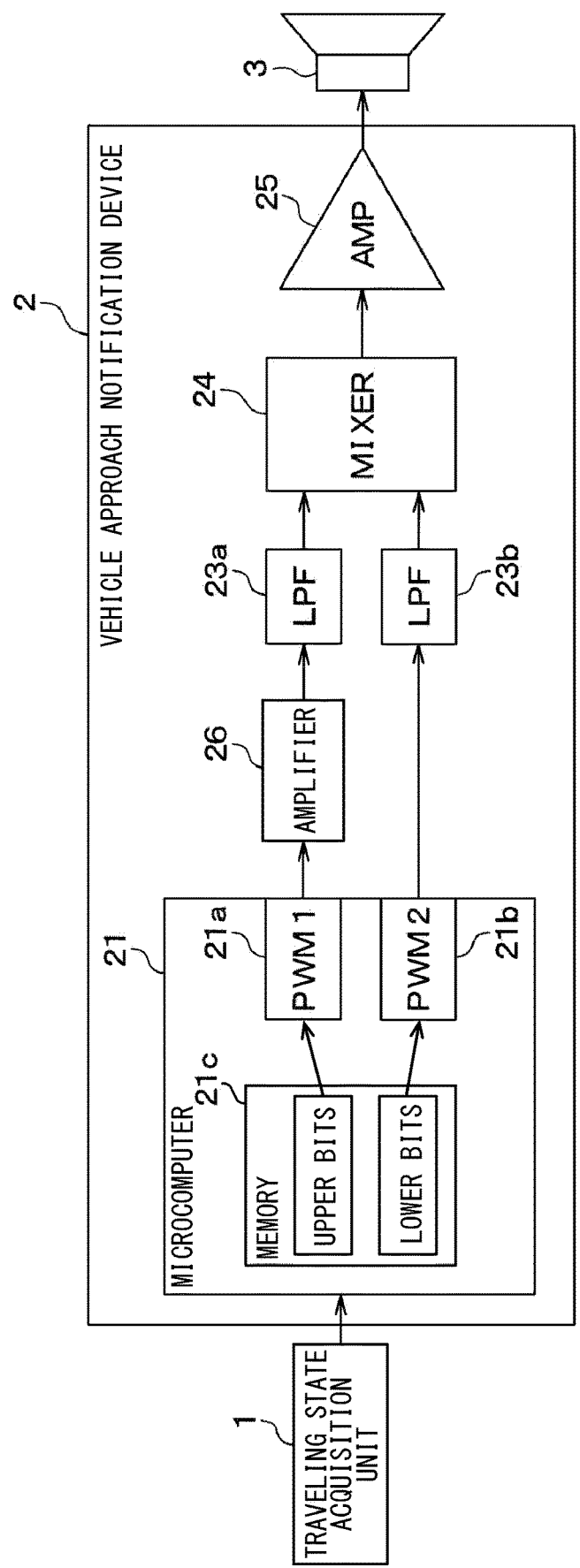
FIG. 5 is a block diagram of a vehicle approach notification device according to a third embodiment.

As shown in FIG. 5, in the present embodiment, the weighting unit includes an amplifier 26 that amplifies the PWM output of the first PWM output device 21a. In this way, even if the PWM output of the first PWM output device 21a is amplified and then combined with the PWM output of the second PWM output device 21b by the mixer 24, the same effect as that of the first embodiment can be obtained. In this case, the amplification factor may be the difference in bit number between the upper bit part and the lower bit part×6 dB.

Other Embodiments

Although the present disclosure has been described in accordance with the above embodiments, it is understood that the present disclosure is not limited to the above embodiments and structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in each of the above embodiments, two PWM output devices, the first PWM output device 21a and the second PWM output device 21b, are provided, and the audio data is divided into two of the upper bit part and the lower bit part, but more than two PWM output devices may also be used and the audio data may be divided according to the number of PWM output devices. That is, multiple PWM output devices are provided, the audio data to be expressed is divided into multiple parts from the upper bit part to the lower bit part and is output as a PWM output from each of PWM output devices, and the PWM outputs are weighted by the weighting unit and combined, so that the original audio data can be expressed.

For example, when reproducing 24-bit audio data, the audio data can be divided into three of 8 bits each for upper, middle and lower parts. In that case, the PWM output of the middle bit PWM output device may be attenuated by a −48 dB attenuator for 8 bits, and the PWM output of the lower bit PWM output device may be attenuated by a −96 dB attenuator for 16 bits, and the PWM outputs after being attenuated may be combined with a mixer.

Further, in each of the above embodiments, as the audio data, the audio data directly stored in the memory in the microcomputer 21 has been described as an example, but the audio data is not limited to the one directly stored in the memory, and may be audio data obtained as a result of calculation and generation.

In the above embodiments, the vehicle approach notification device has been described as an example of the audio output device, but the present disclosure may be applied not only to the vehicle approach notification device but also to a device that emits a sound based on audio data. For example, considering a case where the present disclosure is applied to a vehicle, the present disclosure can be applied to various outdoor notification sound output devices that output sound from the vehicle, including the vehicle approach notification device. For example, as the outdoor notification sound output device, in addition to the vehicle approach notification device, a device that outputs a notification sound in a back buzzer and an answerback notification sound in a smart key system can be mentioned.

What is claimed is:

1. An audio output device comprising:
  a plurality of pulse width modulation (PWM) output devices configured to divide audio data into a plurality of parts including an upper bit part and a lower bit part and output the plurality of parts of the audio data as a plurality of PWM outputs;
  a weighting unit configured to weight the plurality of PWM outputs from the plurality of PWM output devices;
  a mixer configured to synthesize the plurality of PWM outputs after being weighted; and
  an amplifier configured to supply an electric current to a sounding body to cause the sounding body to emit a sound, the electric current corresponding to an output indicating a result of synthesizing by the mixer, wherein
  the weighting unit is an attenuator configured to attenuate the PWM output of the PWM output device of the lower bit part by an attenuation rate obtained by multiplying a difference in bit number of the lower bit part with respect to the upper bit part of the divided audio data by −6 dB.

2. The audio output device according to claim 1, wherein
  the plurality of PWM output devices includes a first PWM output device and a second PWM output device, the audio data is divided into two of the upper bit part and the lower bit part, the first PWM output device is configured to generate the PWM output corresponding to the upper bit part, and the second PWM output device is configured to generate the PWM output corresponding to the lower bit part.

3. The audio output device according to claim 2, wherein
  the audio data is 16 bits, the audio data is divided into upper 8 bits and lower 8 bits, and the first PWM output device is configured to output the PWM output corresponding to the upper 8 bits, and the second PWM output device is configured to output the PWM output corresponding to the lower 8 bits.

4. The audio output device according to claim 1, further comprising
  a filter configured to demodulate the plurality of PWM outputs after being weighted into a plurality of audio waveforms that is a plurality of output waveforms corresponding to the audio data, wherein
  the mixer is configured to synthesize the plurality of PWM outputs after being demodulated into the plurality of audio waveforms by the filter.

5. The audio output device according to claim 1, further comprising
  a filter configured to demodulate the output from the mixer into an audio waveform that is an output waveform corresponding to the audio data, wherein
  the amplifier is configured to cause the sounding body to emit the sound based on the output from the mixer after being demodulated into the audio waveform by the filter.

6. An audio output device comprising:
  a microcomputer including a plurality of pulse width modulation (PWM) output devices and a memory storing audio data, the microcomputer configured to divide the audio data into a plurality of parts including an upper bit part and a lower bit part and set the plurality of parts of the audio data in the plurality of PWM output devices, respectively, the plurality of PWM output devices configured to output the plurality of parts of the audio data as a plurality of PWM outputs, respectively;
  an attenuator or an amplifier configured to weight the plurality of PWM outputs from the plurality of PWM output devices;
  a mixer configured to synthesize the plurality of PWM outputs after being weighted; and
  another amplifier configured to supply an electric current to a speaker to cause the speaker to emit a sound, the electric current corresponding to an output indicating a result of synthesizing by the mixer.

* * * * *